United States Patent
Hwang

(10) Patent No.: US 7,480,187 B2
(45) Date of Patent: Jan. 20, 2009

(54) NONVOLATILE SEMICONDUCTOR MEMORY WITH LOW-LOADING BIT LINE ARCHITECTURE AND METHOD OF PROGRAMMING THE SAME

(75) Inventor: Sang-Won Hwang, Gyeonggi-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 105 days.

(21) Appl. No.: 11/356,417

(22) Filed: Feb. 17, 2006

(65) Prior Publication Data
US 2007/0115724 A1   May 24, 2007

(30) Foreign Application Priority Data
Nov. 23, 2005   (KR) .................. 10-2005-0112458

(51) Int. Cl.
*G11C 11/30* (2006.01)
(52) U.S. Cl. .................. 365/185.33; 365/185.02; 365/185.07; 365/185.1; 365/185.11
(58) Field of Classification Search .......... 365/185.17, 365/185.23, 185.33, 185.28, 185.26, 185.07, 365/185.02, 185.11, 185.1
See application file for complete search history.

(56) References Cited

U.S. PATENT DOCUMENTS

| | | | | |
|---|---|---|---|---|
| 5,581,501 | A * | 12/1996 | Sansbury et al. | 365/185.01 |
| 5,790,457 | A * | 8/1998 | Kim et al. | 365/185.17 |
| 6,288,936 | B1 | 9/2001 | Kawamura | |
| 6,337,807 | B2 * | 1/2002 | Futatsuyama et al. | 365/185.17 |
| 6,757,210 | B2 | 6/2004 | Hong et al. | |
| 6,937,514 | B2 * | 8/2005 | Hasegawa | 365/185.12 |
| 2004/0174727 | A1 | 9/2004 | Park | |

FOREIGN PATENT DOCUMENTS

| | | |
|---|---|---|
| JP | 11-261036 | 9/1999 |
| JP | 2000-207891 | 7/2000 |
| JP | 2001-184893 | 7/2001 |
| JP | 2002-025277 | 1/2002 |
| JP | 2004-273098 | 9/2004 |
| KR | 1020000003337 A | 1/2000 |
| KR | 1020020003074 | 1/2002 |
| KR | 1020040008777 A | 1/2004 |
| KR | 1020040085616 A | 8/2004 |
| KR | 1020040078785 A | 9/2004 |

* cited by examiner

*Primary Examiner*—Pho M. Luu
(74) *Attorney, Agent, or Firm*—Volentine & Whitt, PLLC.

(57) ABSTRACT

A NAND flash memory device includes an array of NAND flash memory cells; a plurality of word lines connected to the NAND flash memory cells; and a plurality of bit lines connected to the NAND flash memory cells. Each bit line includes a first bit line portion, a second bit line portion, and a switching device extending between the first and second bit line portions to selectively connect the first and second bit line portions together. At least a first NAND flash memory cell is connected to the first bit line portion, and at least a second NAND flash memory cell is connected to the second bit line portion. By including primary and secondary page buffers, two pages of memory cells connected to a same group of bit lines can be programmed in a single programming operation, to achieve "double-speed" programming.

20 Claims, 17 Drawing Sheets

Fig. 6

|          |              |              |              |
|----------|--------------|--------------|--------------|
| Sel. W/L | 0            | Vpgm         | 0            |
| Unsel. W/L | Float      | Vpass        | $V_{READ}$   |
| SSL      | Float        | Vcc          | $V_{READ}$   |
| GSL      | Float        | 0            | $V_{READ}$   |
| CSL      | Float        | 0            | 0            |
| "0" B/L  | Float        | 0(program)   | 1.2          |
| "1" B/L  | Float        | Vcc(inhibit) | <0.8         |
| Bulk     | Verase       | 0            | 0            |

NONVOLATILE SEMICONDUCTOR MEMORY WITH LOW-LOADING BIT LINE ARCHITECTURE AND METHOD OF PROGRAMMING THE SAME

BACKGROUND AND SUMMARY

1. Field

This invention relates, in general, to nonvolatile semiconductor memory devices and, more particularly, to NAND flash memory device having an architecture with a reduced bit-line loading, and a method of programming such a device.

2. Description

Semiconductor memories are classified into volatile semiconductor memories and non-volatile semiconductor memories. In the volatile semiconductor memories, data are stored and can be read out as long as the power is applied, and are lost when the power is turned off. On the other hand, non-volatile memories such as an MROM (MASK ROM), a PROM (Programmable ROM), an EPROM (Erasable and Programmable ROM), and an EEPROM (Electrically Erasable and Programmable ROM), and Flash memories are capable of storing data even with the power turned off.

Of these devices, flash memories are classified into NOR-type flash memories and NAND-type flash memories according to a connection structure of a cell and a bitline. The NOR-type flash memory can be easily adapted to high-speed operation, but has a disadvantage when it comes to providing a high degree of integration. In contrast, the NAND-type flash memory is advantageous when it comes to providing a high degree of integration.

FIGS. 1A and 1B illustrate, respectively, an initial state and a programmed state of a flash memory cell transistor having a floating gate.

As shown in FIGS. 1A-B, a single transistor-type flash memory cell 100 generally comprises: a channel formed between a source 105 and a drain 110 on a semiconductor substrate 115; a control gate 120; and a floating gate 130 formed between a dielectric oxide 140 and a gate oxide 150, where dielectric oxide 140, floating gate 130, gate oxide 150, and control gate 120 are stacked on the channel. Floating gate 130 traps electrons, and the trapped electrons are used to establish the threshold voltage of flash memory cell 100. The electrons moving to floating gate 130 are generated by Fowler-Nordheim tunneling (FN), electron injection, etc. Electron injection may be performed by channel hot-electron injection (CHE), channel-initiated secondary electron injection (CISEI), etc. Also, Fowler-Nordheim tunneling (FN) is generally used in flash memory devices for erasing data all at once. Further, when the nonvolatile semiconductor memory device performs a read operation, the data value stored in flash memory cell 100 is determined through sensing the threshold voltage of flash memory cell 100, as discussed in further detail below.

As shown in FIG. 1A, initially flash memory cell 100 is in a "non-programmed" (or "erased") state and stores a logical "1" therein. In the non-programmed state, flash memory cell 100 has an initial threshold voltage, $V_{TH1}$, such that when a voltage less than $V_{TH1}$ is applied to control gate 120, flash memory cell 100 is turned off, but when a voltage greater than $V_{TH1}$ is applied to control gate 120, flash memory cell 100 is turned on. $V_{TH1}$ is typically from −1V to −3V.

Meanwhile, as shown in FIG. 1B, flash memory cell 100 stores a logical "0" when it is in a "programmed" state. In the programmed state, memory cell 100 has an initial threshold voltage, $V_{TH2}$ greater than $V_{TH1}$, such that when a voltage less than $V_{TH2}$ is applied to control gate 120, flash memory cell 100 is turned off, but when a voltage greater than $V_{TH2}$ is applied to control gate 120, flash memory cell 100 is turned on. $V_{TH2}$ is typically from +1V to +3V.

FIGS. 2A and 2B illustrate, respectively an erase operation and a programming operation for flash memory cell 100.

As seen in FIG. 2A, an erase operation is performed on flash memory cell 100 to store logical a "1" therein by applying an erase voltage "$V_{ERASE}$" to the bulk substrate 115 of flash memory cell 100 and grounding control gate 120 to thereby remove electrons from memory cell 100's floating gate 130. Removing electrons from floating gate 130 reduces the threshold voltage of flash memory cell 100 to $V_{TH1}$. In a typical example, threshold voltage $V_{TH1}$ may be distributed from −1V to −3V. After the erase operation is performed on flash memory cell 100, it is referred to as an "Erased Cell", and it stores a logical "1." In general, the erase voltage $V_{ERASE}$ is greater than an operating voltage $V_{CC}$ of the NAND flash memory device. For instance, the erase voltage could be 19V while operating voltage $V_{CC}$ is only 5V.

As seen in FIG. 2B, a programming operation is performed on flash memory cell 100 to store a logical '0' therein by applying a program voltage $V_{PGM}$ to control gate 120 of flash memory cell 110, and causing current to flow source 105 and drain 110 to thereby cause electrons in the current to be stored in floating gate 130. Storing electrons in floating gate 130 increases the threshold voltage of flash memory cell 100 to $V_{TH2} > V_{TH1}$. In a typical example, threshold voltage $V_{TH2}$ may be distributed from +1V to +3V. After the programming operation is performed on flash memory cell 100, it is referred to as a "Programmed Cell", and it stores a logical "0."

FIG. 3 illustrates the architecture of a basic NAND flash memory device 300, comprising a memory cell array 320, a plurality (m) of row decoders 340, a page buffer block 360, and a column decoder 380. Memory cell array 320 comprises a plurality of memory blocks 325. Each memory block 325 comprises a plurality (k+1) of memory cell strings ("strings") each connected to a corresponding bit line 330. In turn, each bit line 330 is connected to a plurality of strings—one string in each memory block 325. Page buffer block 360 includes a plurality of page buffers.

FIG. 4 illustrates the organization of memory block 400 of a basic NAND flash memory cell array, and an associated page buffer block 450 including a plurality of page buffers PB0 through PBz. As seen in FIG. 3, in general a memory cell array comprises a number (m) of such memory blocks 400, with the size of the array being defined by the block size multiplied by the number of memory blocks; i.e., ((n+1)*(k+1))*m. Two bit lines are connected to each page buffer PBi, which has a selection means to switch between the two (even and odd) bit lines. Page buffer block 450 loads data onto the bit lines during a data programming operation, and during a data read operation page buffer block 450 latches and senses data transferred onto the bit lines. The memory cells connected to one word line define a page of memory cells.

FIG. 5 illustrates in more detail a basic NAND flash memory cell array including a plurality of NAND flash memory cell strings ("strings") 500 connected to bit lines BL0 through BLk, respectively. Each string 500 comprises a string select transistor (SST), a ground select transistor (GST), and a plurality of flash memory cells 100 serially connected between string selection transistor SST and ground select transistor GST. Typically, either 16 or 32 flash memory cells 100 are serially connected in flash memory cell string 500. String select transistor SST has a drain connected to a corresponding bit line and a gate connected to a string select line SSL. Memory cells 100 are connected to corresponding word lines WL0 through WLn, respectively. Ground select transistor (GST) has a drain connected to a cell source line (CSL). Word lines WL0 through WLn, string select line SSL, and ground select line GSL are driven by a row decoder circuit (see FIG. 3).

In order to program the memory cells of a selected row (or word line) of a NAND flash memory device, the memory cells in a memory block are first erased in order to give each memory cell the threshold voltage $V_{TH1}$ that is less than 0V (all memory cells store a logical "1."). Once the memory cells are erased, program data is loaded onto the page buffers of the NAND flash memory device, and then a high voltage pump circuit generates relatively high voltage programming pulses for a programming operation. Afterward, the loaded data is programmed into the memory cells of a selected word line by the iteration of program loops including a sequence of programming pulses. Each of the program loops consists of a bit line setup interval, a program interval, a discharge/recovery interval, and a verification interval.

During the bit line setup interval, each of the bit lines BL0 through BLk is charged to a power supply voltage or a ground voltage in accordance with the loaded program data. That is, a bit line BL connected to a memory cell to be programmed with a "0" is charged to the ground voltage, and a bit line BL connected to a memory cell to be program inhibited (i.e., not programmed) so as to remain storing a logical "1" is charged to the power supply voltage. Within the program interval, the program voltage $V_{PGM}$ is supplied to a selected word line and the pass voltage $V_{PASS}$ is supplied to the unselected word lines. For memory cells connected to the selected word line and to bit lines that are charged to the ground voltage, a bias condition great enough to induce F-N tunneling is satisfied, so electrons are injected from the bulk to the floating gates of the memory cells. On the other hand, as is well known in the art, memory cells connected to bit lines that are charged to the power supply voltage are program inhibited. The voltages of the bit lines and the word lines are discharged during the discharge interval, which functions as a recovery interval, and whether the memory cells have reached a target threshold voltage is determined during the verification interval.

FIG. 6 shows the voltage conditions for various operations of a NAND flash memory cell array.

FIG. 7 is a more detailed diagram showing the arrangement of a bit line and a plurality of associated strings in a memory device. As can be seen in FIGS. 5 and 7, each string is connected to a bit line through a string select transistor, and the bit line in turn is connected to a page buffer. The bit line itself has no serially connected transistors or switches between the page buffer and the string select transistor SST.

However, this arrangement has some drawbacks. Since all of the blocks are connected to each bitline, as the number of blocks increase, the loading on the bitline also increases, slowing down an operational speed of the memory device. Also, only one memory cell connected to one word line can be programmed at one time among all of the word lines of all of the blocks connected to each bitline. So the speed of programming the memory device decreases as more memory blocks are connected to a bit line to increase the storage capacity of the memory device.

Accordingly, it would be desirable to provide a NAND flash memory device with a reduced bitline load. It would also be desirable to provide a NAND flash memory device which can be programmed more rapidly. Other and further objects and advantages will appear hereinafter.

The present invention comprises a nonvolatile semiconductor memory with low-loading bit line architecture and a method of programming the same.

In one aspect of the invention, a NAND flash memory device comprises: an array of NAND flash memory cells; a plurality of word lines connected to the NAND flash memory cells; and a plurality of bit lines connected to the NAND flash memory cells. The bit lines each comprise, a first bit line portion, a second bit line portion, and a switching device extending between the first and second bit line portions to selectively connect the first and second bit line portions together. At least a first NAND flash memory cell is connected to the first bit line portion, and at least a second NAND flash memory cell is connected to the second bit line portion.

In another aspect of the invention, a method is provided for programming the NAND flash memory cells of a NAND flash memory device comprising an array of NAND flash memory cells arranged in a plurality of word lines and a plurality of bit lines, the bit lines each comprising a first bit line portion, a second bit line portion, and a switching device extending between the first and second bit line portions to selectively connect the first and second bit line portions, and further comprising a first page buffer connected to the first bit line portions and a second page buffer connected to the second bit line portions. The method of programming the NAND flash memory cells comprises: loading into the primary page buffer second data to be programmed into second NAND flash memory cells connected to the second bit line portions; transferring the second data from the primary page buffer to the secondary page buffer; loading into the primary page buffer first data to be programmed into first NAND flash memory cells connected to the first bit line portions; controlling the switching devices to disconnect the first and second portions of the bit lines from each other; and programming the first NAND flash memory cells with the first data of the primary page buffer while programming the second NAND flash memory cells with the second data of the secondary page buffer.

BRIEF DESCRIPTION OF THE DRAWINGS

FIG. 6 shows the voltage conditions for various operations of a NAND flash memory cell array;

DETAILED DESCRIPTION

Figure 1B:
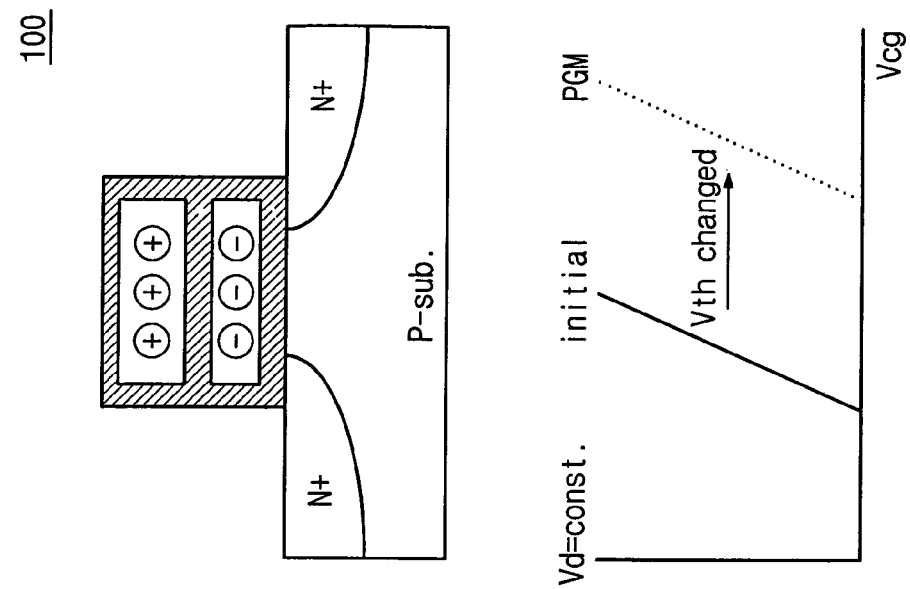
FIGS. 1A-B illustrate a single transistor-type flash memory cell.
Figure 1A:
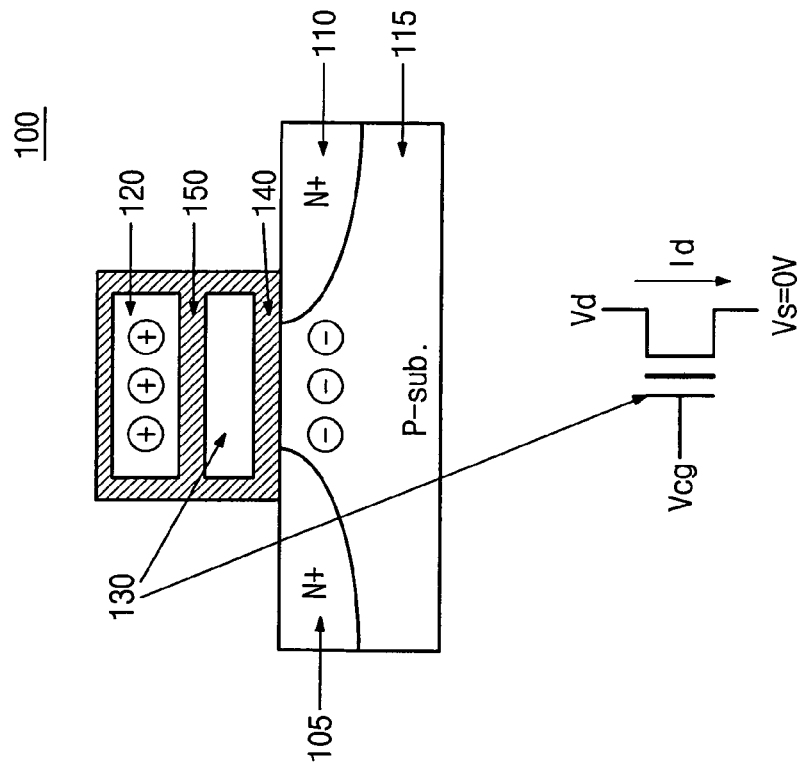
Figure 2A:
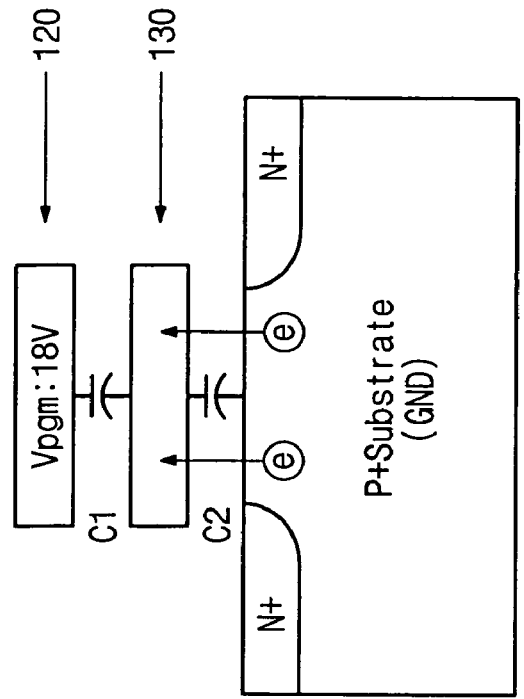
FIGS. 2A-B illustrate an erase and programming operation of a flash memory cell.
Figure 2B:
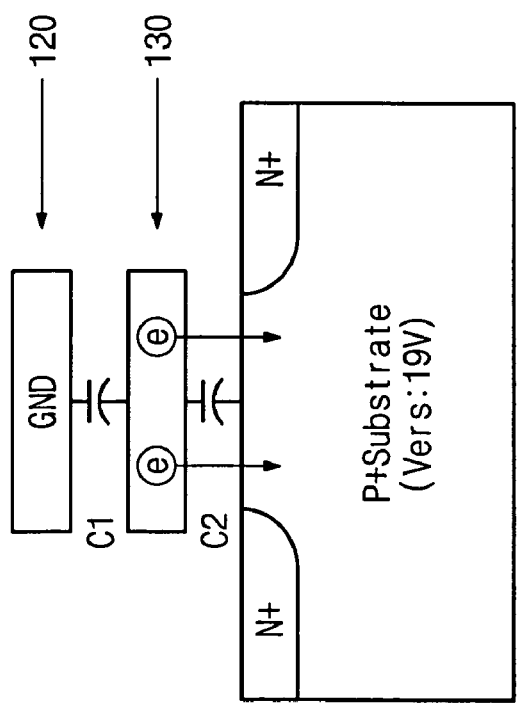
Figure 3:
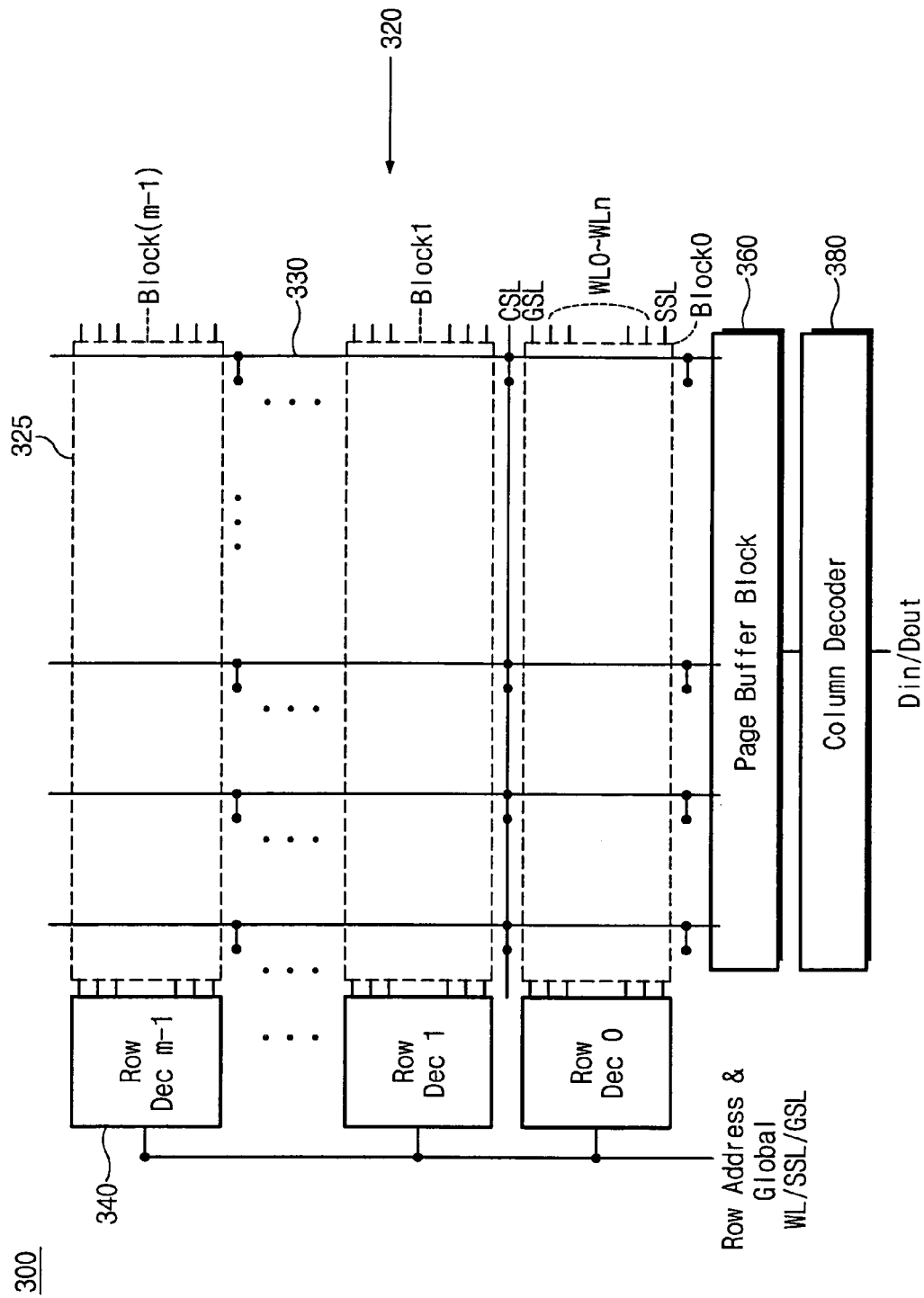
FIG. 3 illustrates the architecture of a basic NAND flash memory device.
Figure 4:
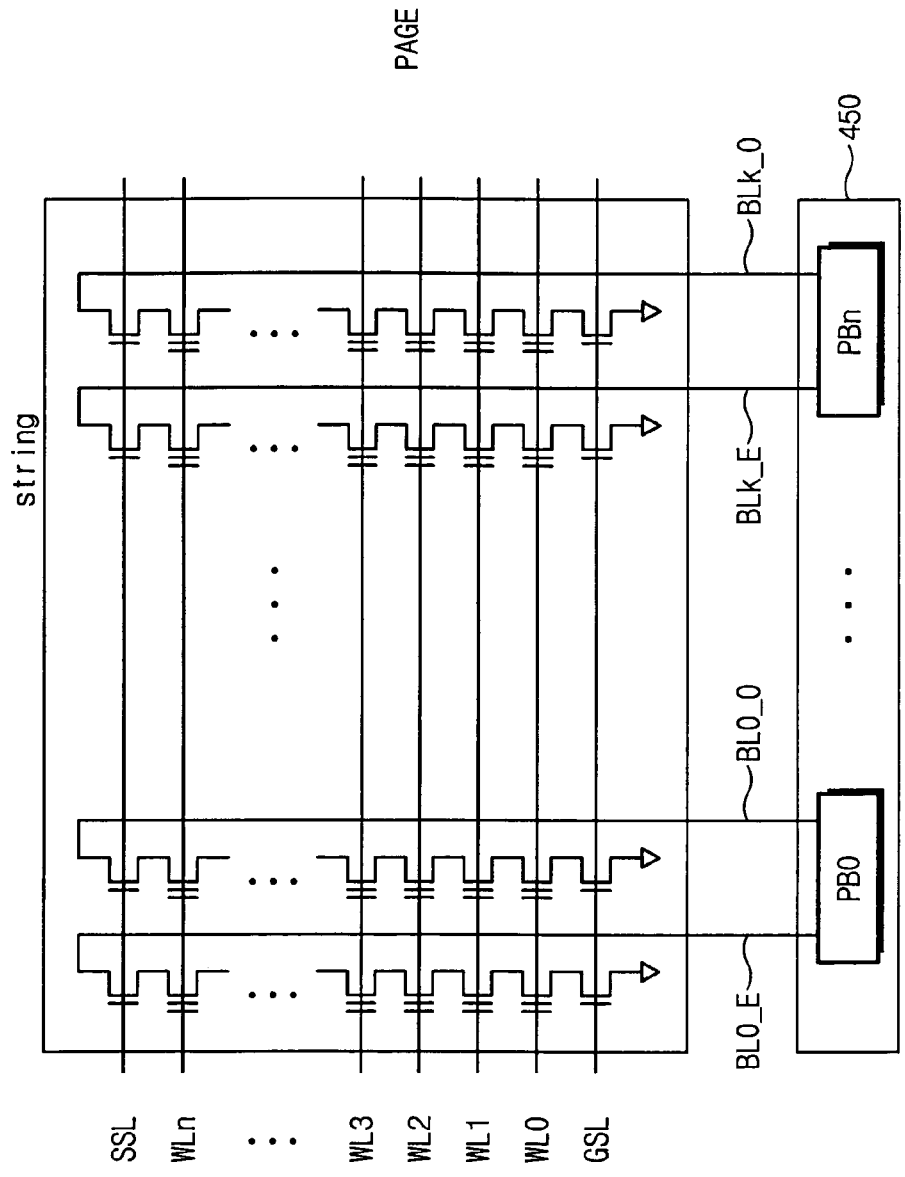
FIG. 4 illustrates the organization of memory block of a basic NAND flash memory cell array, and an associated page buffer block.
Figure 5:
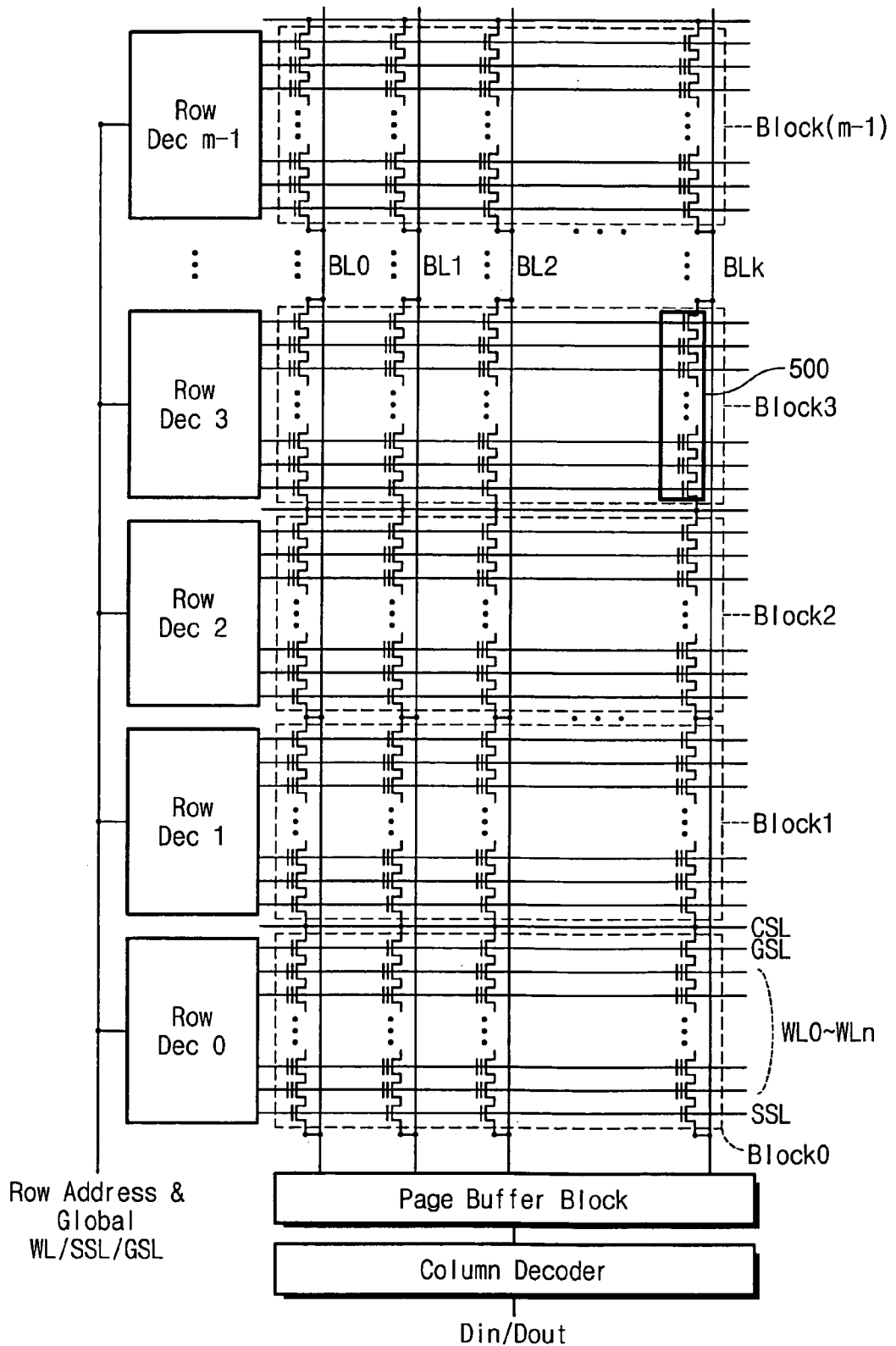
FIG. 5 illustrates a NAND flash memory cell array.
Figure 7:
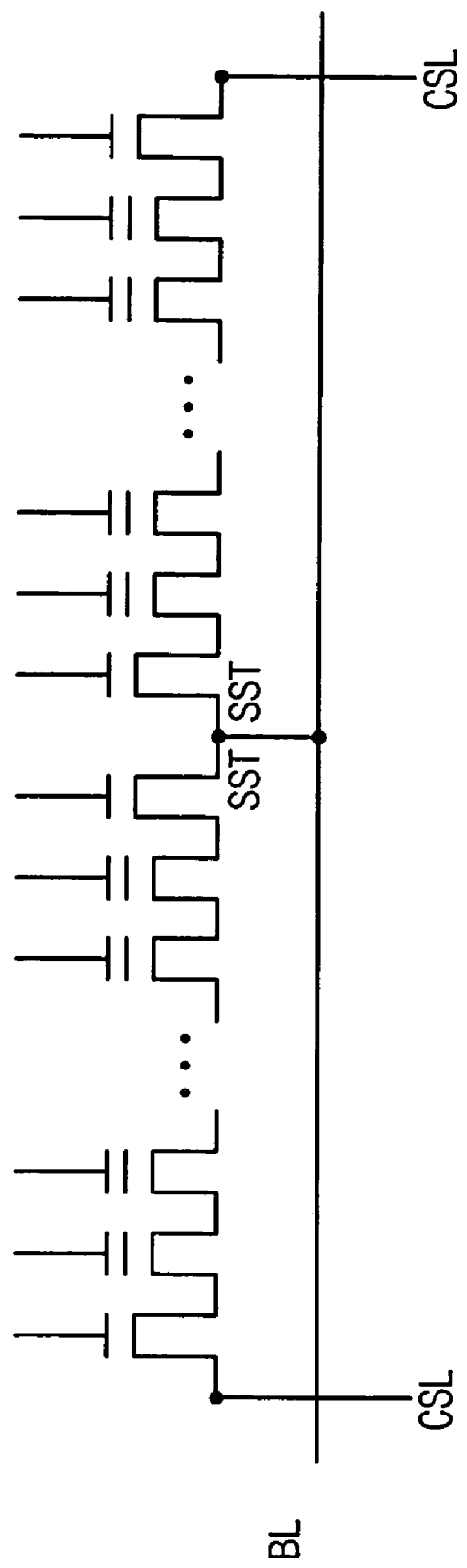
FIG. 7 shows the arrangement of a bit line and a plurality of associated strings in a memory device.
Figure 8:
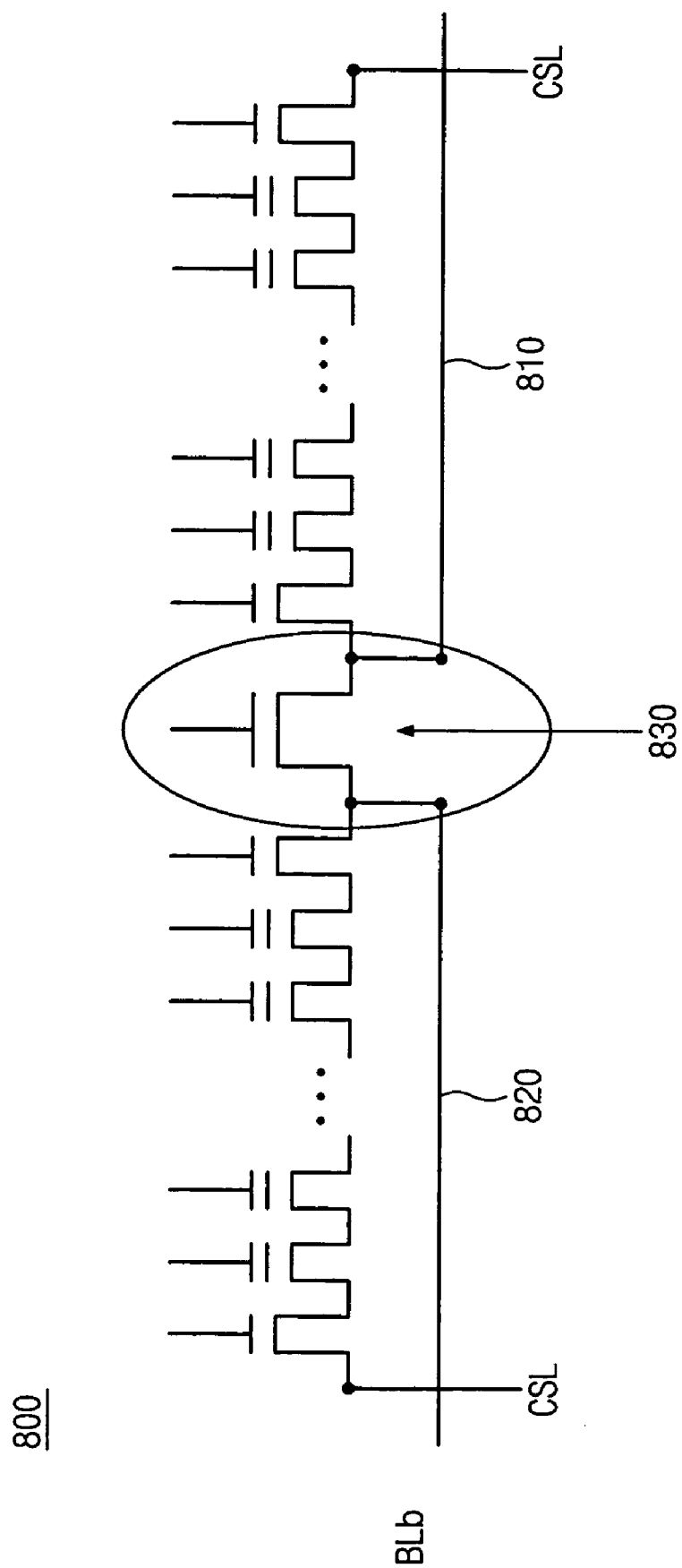
FIG. 8 shows the arrangement of a bit line and a plurality of associated strings in a memory device according to one or more aspects of the present invention.

FIG. 8 shows an arrangement of a bit line and a plurality of associated memory cells in a memory device according to one or more aspects of the present invention.

As can be seen in FIG. 8, the bit line 800 includes a first bit line portion 810, a second bit line portion 820, and a switching device (e.g., a bit line transistor) 830 extending between first and second bit line portions 810/820, to selectively connect first and second bit line portions 810/820 together. One or more first NAND flash memory cells are connected to first bit line portion 810, and one or more second NAND flash memory cells are connected to second bit line portion 820. That is, switching device 830 is connected in series in bit line 800 between first bit line portion 810 and second bit line portion 820.

Figure 9:
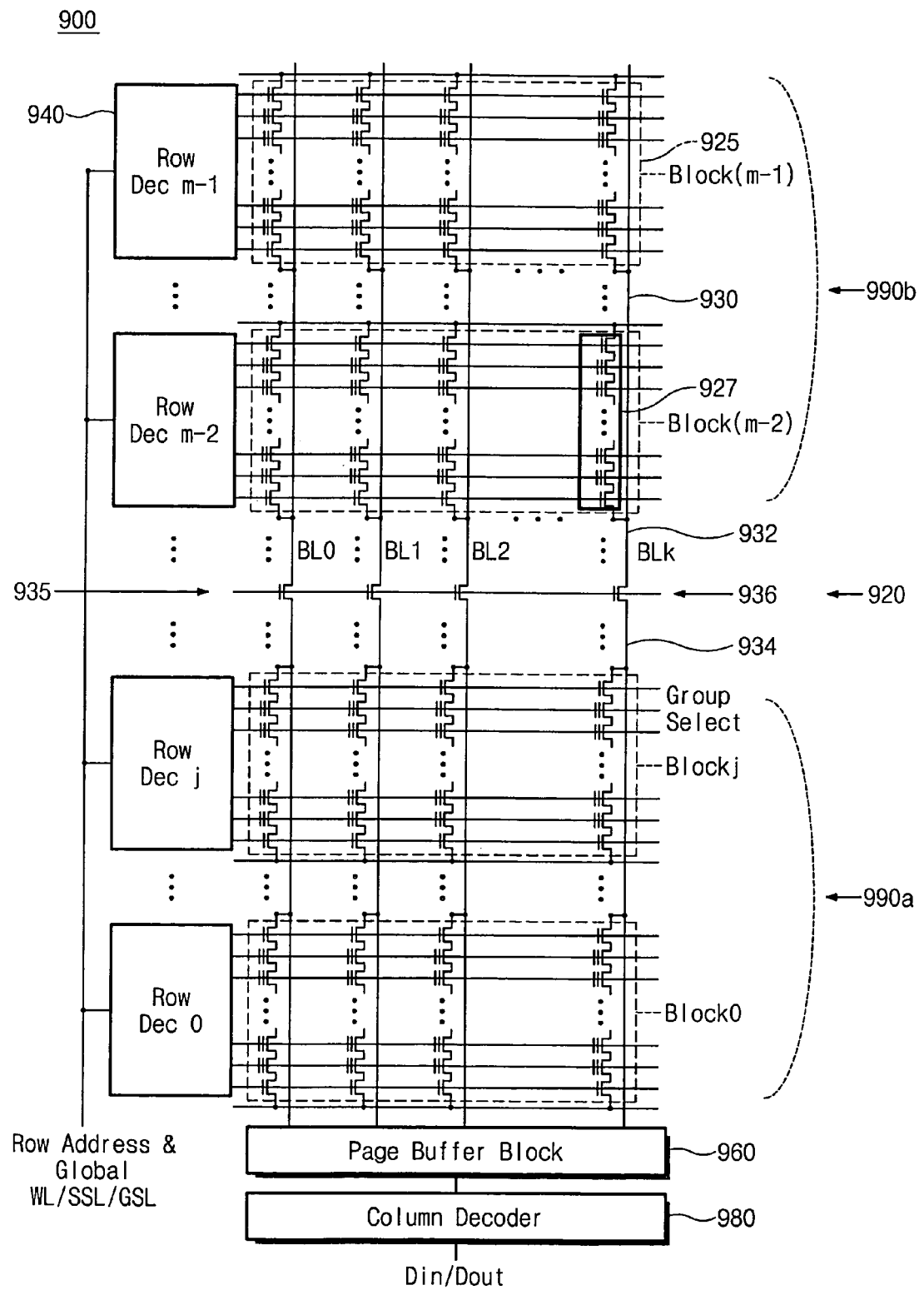
FIG. 9 illustrates the architecture of a NAND flash memory device according to one or more aspects of the present invention.

FIG. 9 illustrates the architecture of a NAND flash memory device 900 according to one or more aspects of the present invention, comprising a memory cell array 920, a plurality (m) of row decoders 940, a page buffer block 960, and a column decoder 980. Memory cell array 920 comprises a plurality of memory blocks 925. Each memory block 925 comprises a plurality (k+1) of memory cell strings ("strings") 927 each connected to a corresponding bit line 930. In turn, each bit line 930 is connected to a plurality of strings 927— one string in each memory block 925.

Furthermore, each bit line 930 includes a first bit line portion 932, a second bit line portion 934, and a switching device (e.g., a bit line transistor) 936 extending between first and second bit line portions 932/934, to selectively connect first and second bit line portions 932/934 together in response to a group select signal on a group select line 935 connected to a control terminal of switching device 936. That is, the memory blocks 925 are divided into two groups 990a and 990b by switching devices 936.

Although the embodiments shown in FIGS. 8 and 9 show a bit line including a single switching device dividing the memory blocks into two groups, in general, the bit lines may include two or more (e.g., n−1) switching devices dividing the memory blocks into three or more (e.g., n) groups.

Figure 10:
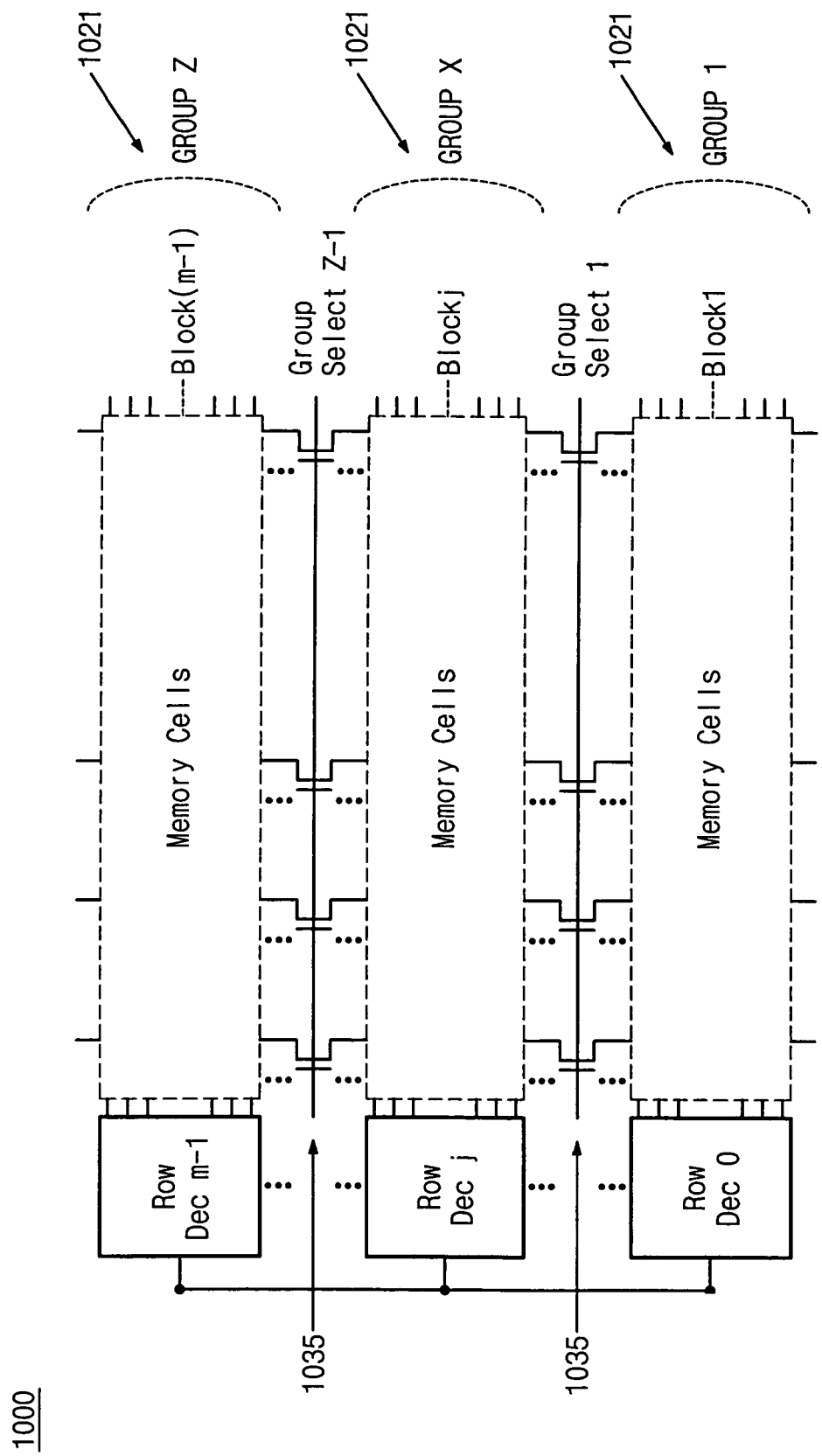
FIG. 10 shows one embodiment of a memory cell array according to one or more aspects of the present invention.

FIG. 10 shows one embodiment of a memory cell array 1000 comprising "Z" groups 1021 of "m" memory blocks, each pair of adjacent groups 1021 being separated by a group select line 1035 connected to control terminals of switching devices for each of the bit lines. In general, each of the Z groups 1021 of memory cells may include one or more memory blocks.

Figure 11C:
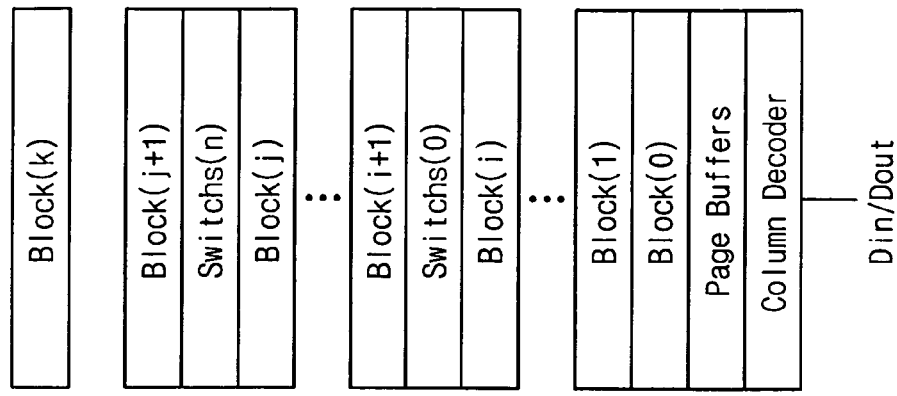
FIGS. 11A-C show three exemplary configurations of memory blocks and groups within a memory cell array according to one or more aspects of the present invention.
Figure 11B:
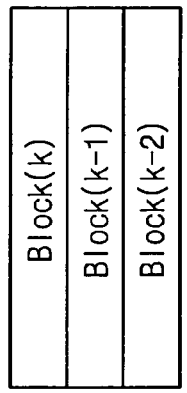
Figure 11A:
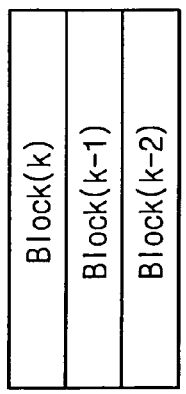

FIGS. 11A-C show three exemplary configurations of memory blocks and groups within a memory cell array. In FIG. 11A, the memory blocks Block(0) to Block(k) are divided into two groups having different sizes, the first group including only Block(0), and the second group including Block(1) through Block(k). In FIG. 11B, the memory blocks Block(0) to Block(k) are divided into two groups having the same size, the first group including Block(0) through Block(((k+1)/2)−1), and the second group including Block((k+1)/2) through Block(k). In FIG. 11C, the memory blocks Block(0) through Block(k) are divided into p groups having a variety of different sizes.

Figure 12C:
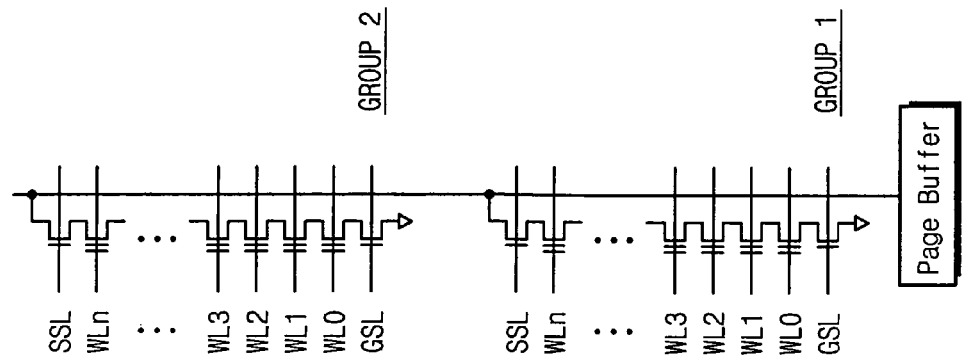
FIGS. 12A-C illustrate an operation of a memory device having two memory groups connected to a same collection of bit lines and a same group of column decoders.
Figure 12B:
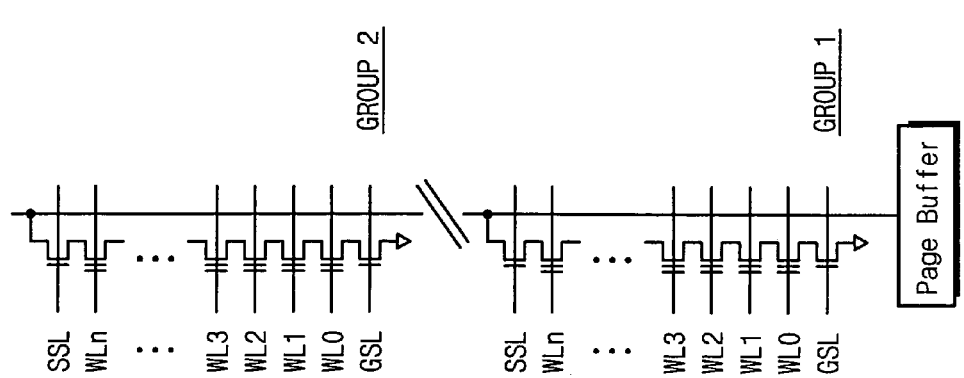
Figure 12A:
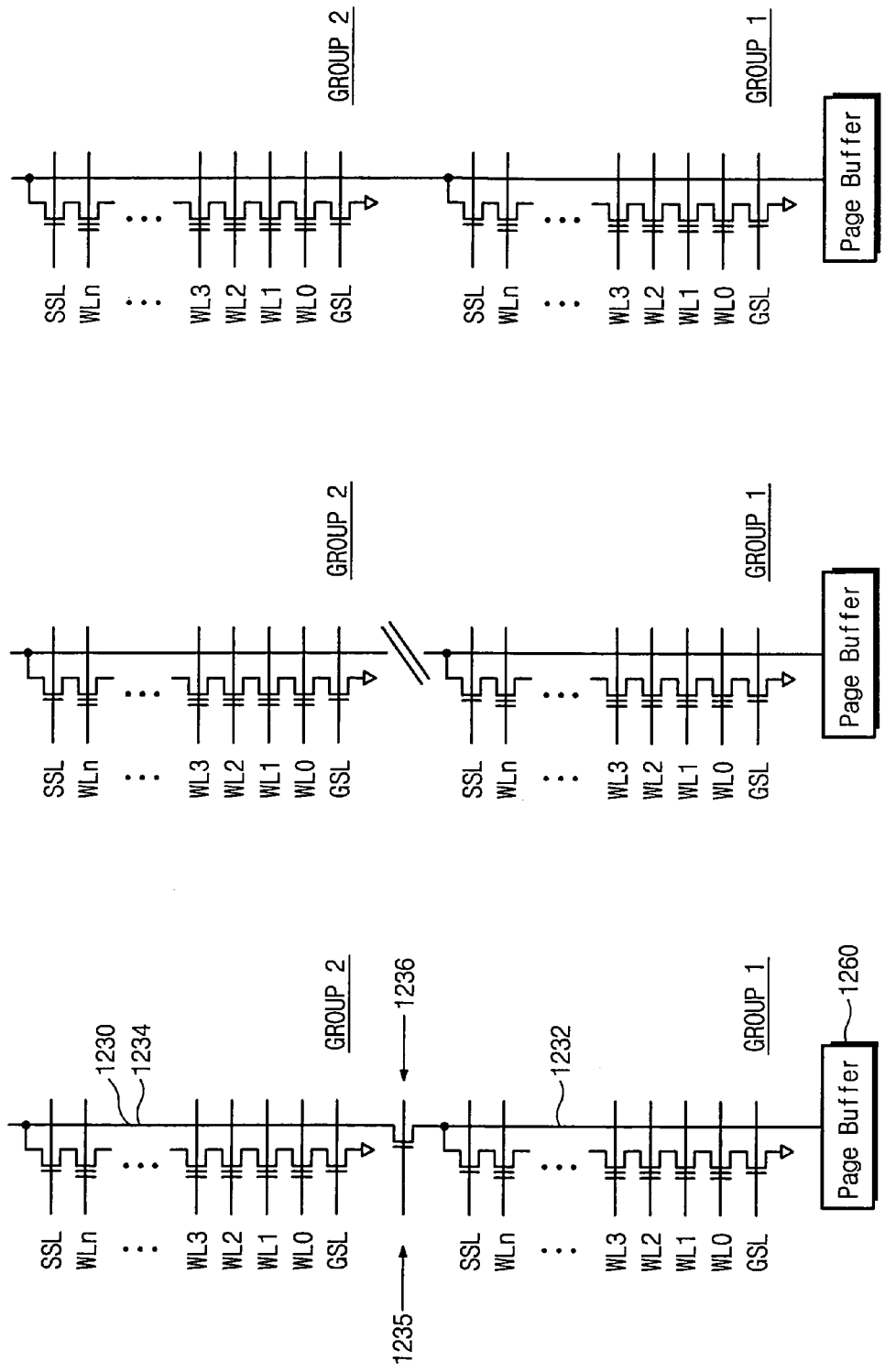

FIGS. 12A-C illustrate an operation of a memory device having two memory groups connected to a same collection of bit lines and a same group of column decoders. The two groups share a plurality of bit lines, although only a single bit line 1230 is shown in FIGS. 12A-C for simplification. Bit line 1230 includes a first bit line portion 1232, a second bit line portion 1234, and a switching device (e.g., a bit line transistor) 1236 extending between first and second bit line portions 1232/1234, to selectively connect first and second bit line portions 1232/1234 together in response to a group select signal on a group select line 1235 connected to a control terminal of switching device 1236.

FIG. 12B shows a case where one or more memory cell(s) of a first group 1 are being accessed for an erase, program, or read operation. In FIG. 12B, the first group 1 is selected by the group select line signal, so as to turn off switching device 1236 and thereby disconnect first bit line portion 1232 from second bit line portion 1234. Accordingly, the load on bit line 1230 seen by page buffer 1260 during an operation for memory cells in the first group 1 is reduced.

FIG. 12C shows a case where one or more memory cell(s) of a second group 2 are being accessed for an erase, program, or read operation. In FIG. 12C, the second group 2 is selected by the group select line signal, so as to turn on switching device 1236 and thereby connect first bit line portion 1232 and second bit line portion 1234. Accordingly, the memory cells in the second group 2 are connected to page buffer 1260 during the operation for memory cells in the second group 2.

Figure 13:
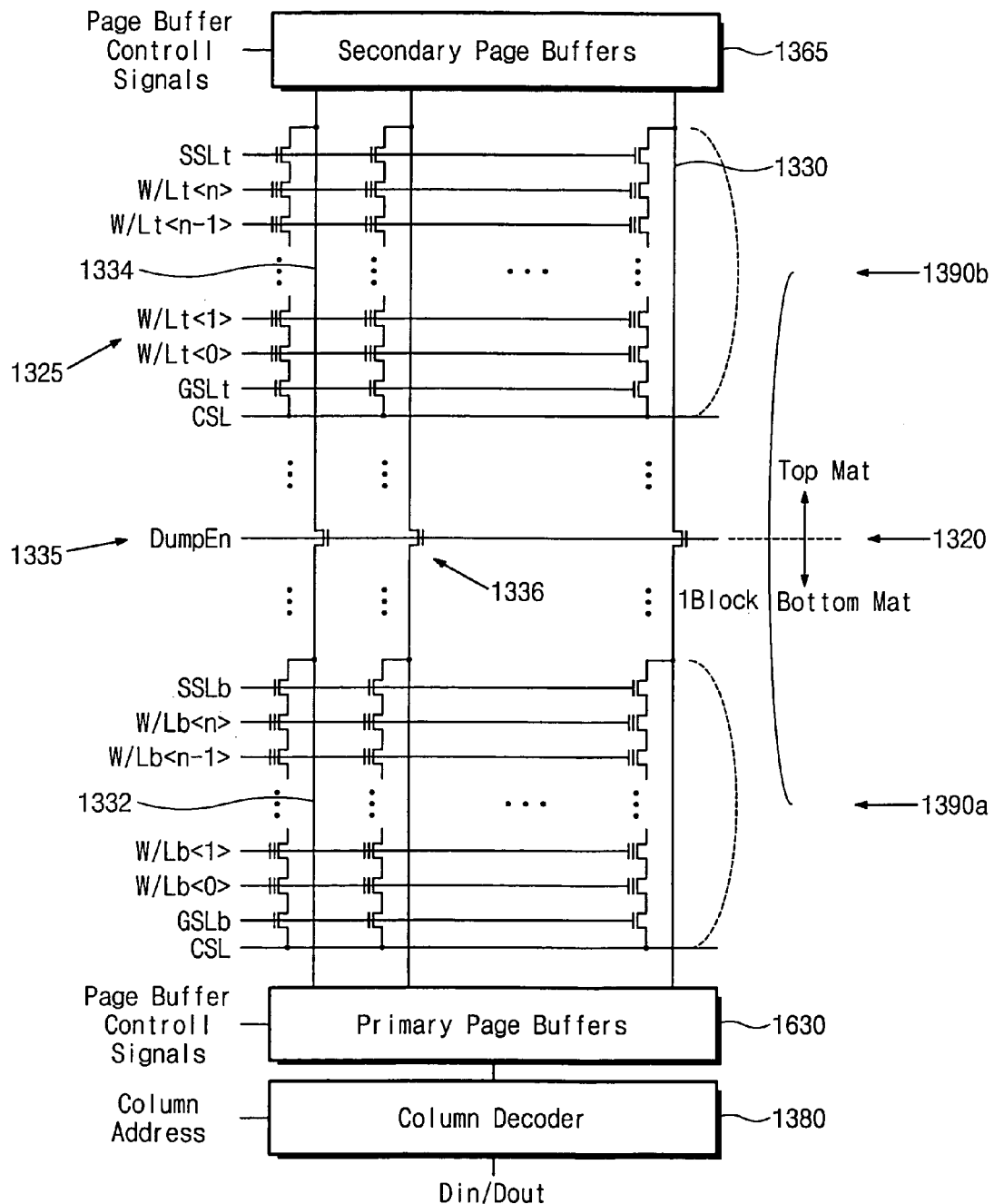
FIG. 13 is a block diagram illustrating portions of another embodiment of a NAND flash memory device according to one or more aspects of the present invention.
Figure 14:
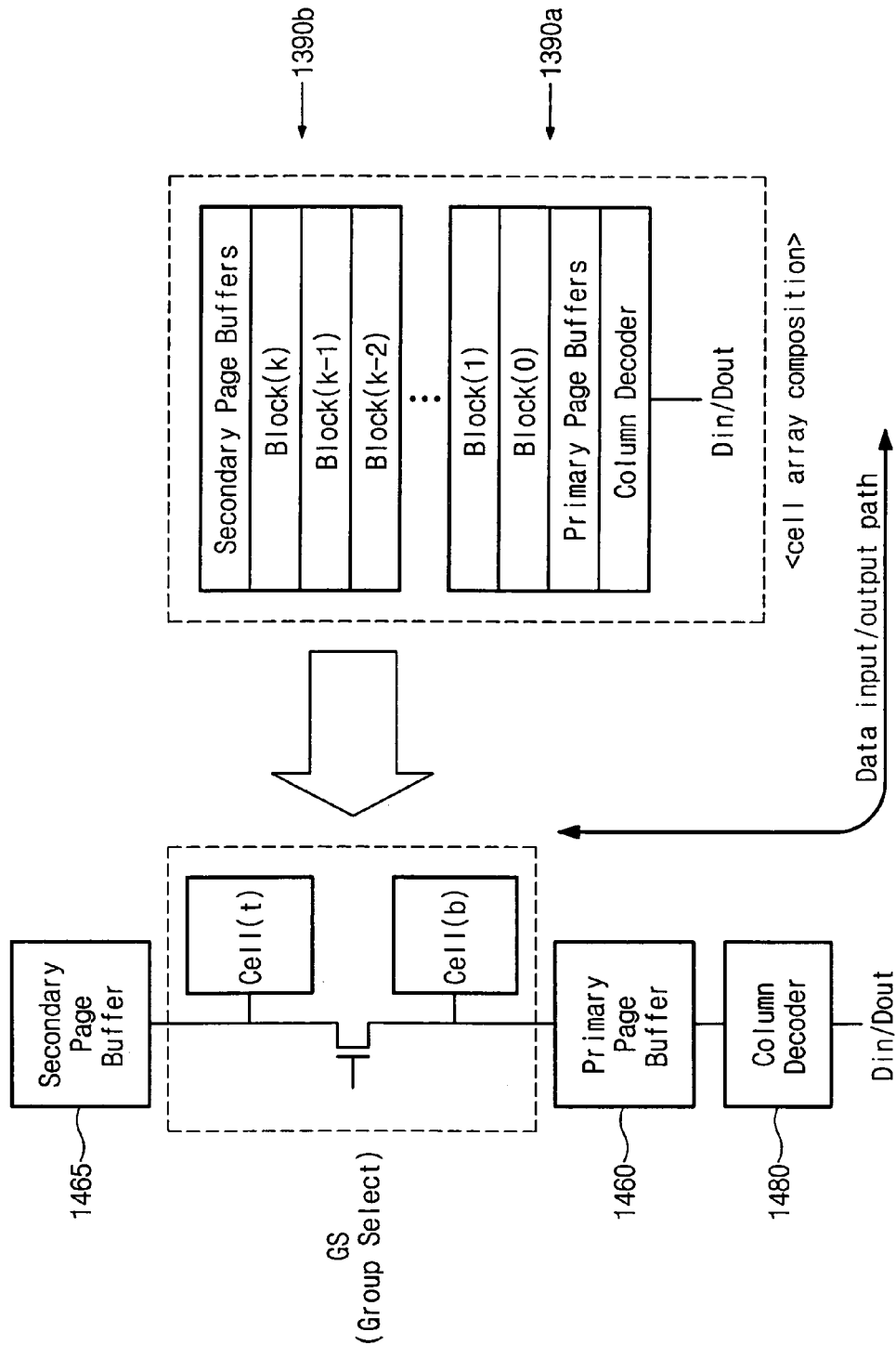
FIG. 14 illustrates a data flow through the NAND flash memory device of FIG. 13.

FIG. 13 is a block diagram illustrating portions of another embodiment of a NAND flash memory device 1300, and FIG. 14 shows a more detailed view of a portion of NAND flash memory device 1300. NAND flash memory device 1300 includes a memory cell array 1320, a plurality (m) of row decoders (not shown), a primary page buffer block 1360, a secondary page buffer block 1365, and a column decoder 1380. Memory cell array 1320 comprises a plurality of memory blocks 1325. Each memory block 1325 comprises a plurality of memory cell strings ("strings") 1327, each connected to a corresponding bit line 1330. Primary page buffer block 1360 includes a plurality of primary page buffers, and secondary page buffer block 1365 includes a plurality of secondary page buffers.

Each bit line 1330 includes a first bit line portion 1332, a second bit line portion 1334, and a switching device (e.g., a bit line transistor) 1336 extending between first and second bit line portions 1332/1334, to selectively connect first and second bit line portions 1332/1334 together in response to a group select signal on a group select line 1335. That is, the memory blocks 1325 are divided into two memory groups 1390a and 1390b by switching devices 1336.

As illustrated in FIG. 14, the data input/output path for all data is through column decoder 1380 and primary page buffer block 1360. In other words, secondary page buffer block 1365 is not connected to any data input/output bus of column decoder 1380, and data for memory cells in second memory group 1390b is loaded to and from secondary page buffer block 1365 via primary page buffer block 1360.

The presence of secondary page buffer block 1365 opens up a possibility for the memory cell array 1320 to function as a single memory cell array, or as two independent memory cell arrays corresponding to the two groups 1390a and 1390b. That is, with the configuration of FIGS. 13 and 14, two memory cells connected to one bit line 1330 may be independently programmed with different data values during a single programming operation, and may both be read during a single read operation.

Figure 15:
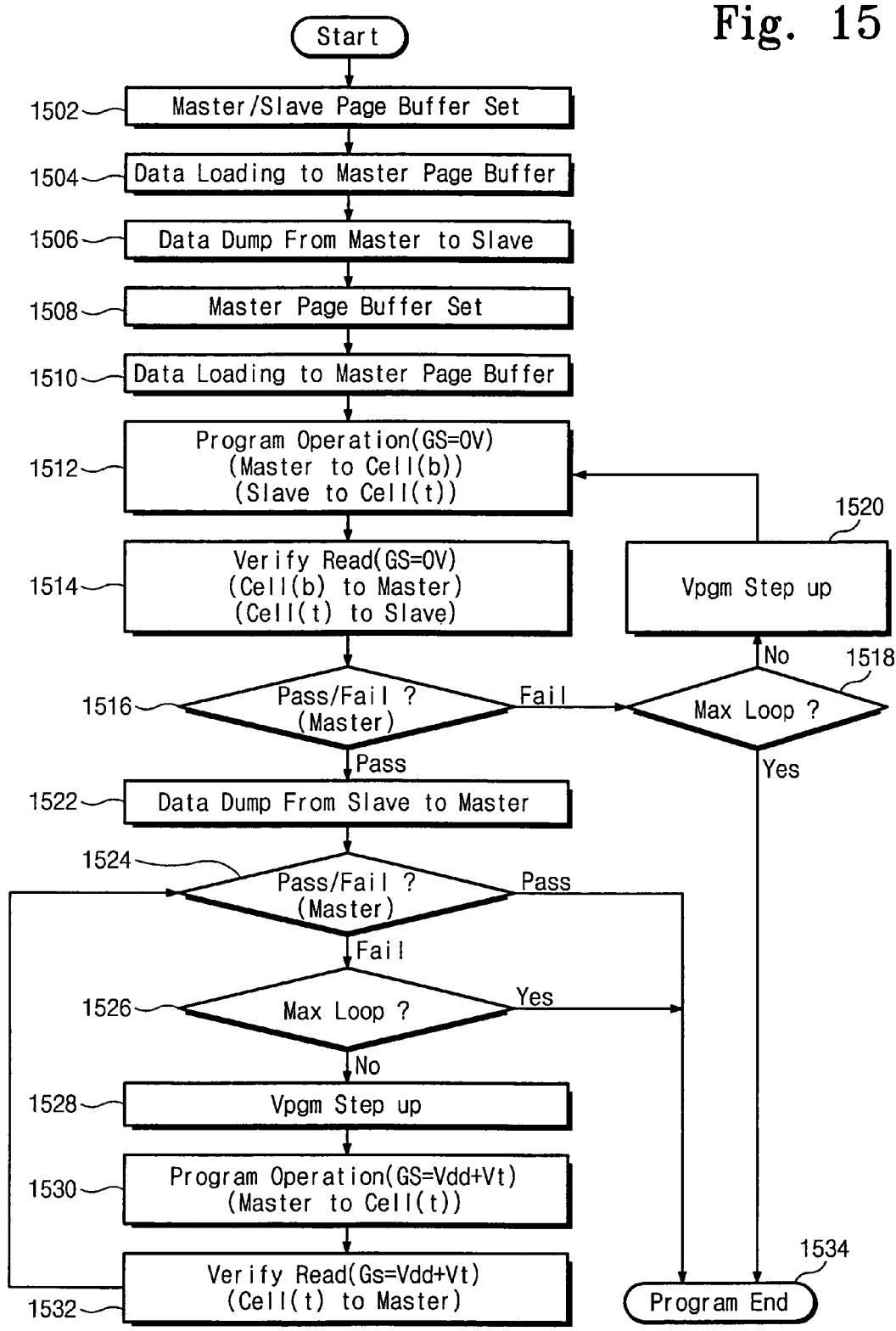
FIG. 15 shows an embodiment of a primary page buffer.

FIG. 15 is a flowchart for explaining an exemplary method 1500 of "double-speed" programming of memory cells in NAND flash memory device 1300 having the bit lines 1330 each including switching device 1136, and further having primary/secondary page buffer blocks 1360/1365.

In a first step 1502, the primary and secondary page buffers are initialized.

Then, in a step 1504, data to be programmed into memory cells connected to a second selected word line of the second group of memory cells 1390b is loaded from the column decoder to the primary page buffers.

Next, in step 1506, the data loaded into the primary page buffers are loaded to the secondary page buffers. During this process, switching devices 1336 in bit lines 1330 are controlled so as to connect first and second bit line portions 1332/1334 together (e.g., group select lines 1335 have a high voltage level, turning on the connected bit line transistors). After the data is transferred from the primary page buffers to the secondary page buffers, then switching devices 1336 in bit lines 1330 are controlled so as to disconnect first and second bit line portions 1332/1334 from each other (e.g., group select lines 1335 have a low voltage level, turning off the connected bit line transistors).

Then, in a step 1508, the primary page buffers are again initialized.

In a step 1510, data to be programmed into memory cells connected to a first selected word line of the first group of memory cells 1390a is loaded from column decoder 1380 to the primary page buffers.

At this point, the device is ready to actually program the data into the memory cells connected to the selected word line of the first group of memory cells 1390a and the memory cells connected to the selected word line of the second group of memory cells 1390b. Accordingly, in a step 1512, while the appropriate voltage is applied to each bit line 1330, the SSLs are supplied with $V_{CC}$, the GSLs are supplied with 0 volts, a $V_{PGM}$ programming voltage pulse is applied to the first and second selected word lines of the first and second groups 1390a and 1390b respectively, and $V_{PASS}$ is applied to the unselected word lines of the first and second groups 1390a and 1390b (see FIG. 6) to program the selected memory cells. During this step, switching devices 1336 in bit lines 1330 are controlled so as to disconnect first and second bit line portions 1332/1334 from each other (e.g., group select lines 1335 have a low voltage level such as ground, turning off the connected bit line transistors).

Next, in step 1514, a data read operation is performed to verify whether data has been correctly programmed into all of the memory cells to be programmed. In this step, the appropriate voltages are applied to the SSL, GSL, CSL, selected word lines and unselected word lines, etc. (see FIG. 6). Data from the selected memory cells of the first group 1390a is transferred to the primary page buffers, and data from the selected memory cells of the second group 1390b is transferred to the secondary page buffers. During this step, switching devices 1336 in bit lines 1330 are controlled so as to disconnect first and second bit line portions 1332/1334 from each other (e.g., group select lines 1335 have a low voltage level such as ground, turning off the connected bit line transistors).

In a subsequent step 1516, it is determined whether the data has been correctly programmed into all of the memory cells to be programmed in the first group 1390a of memory cells (the data that was transferred to the primary page buffers). If it is determined in step 1516 that the data programming operation has failed, then the process proceeds to step 1518.

In step 1518, it is checked whether or not a maximum number of programming pulses have been applied to the selected word lines. If so, then the process proceeds to step 1534 where the programming operation ends. Otherwise, the process proceeds to step 1520 where, beneficially, the programming voltage $V_{PGM}$ is "stepped-up" (increased) in voltage before the process returns to step 1512 to apply an additional programming pulse to the selected word lines.

Meanwhile, if it is determined in step 1516 that the data programming operation for the first group 1390a has succeeded, then the process proceeds to step 1522. In step 1522, data is dumped or transferred from the secondary page buffers to the primary page buffers. That is, the data that has been stored in the memory cells connected to the selected word line of the second group of memory cells 1390b is transferred from the secondary page buffers to the primary page buffers. During this step, switching devices 1336 in bit lines 1330 are controlled so as to connect first and second bit line portions 1332/1334 together (e.g., group select lines 1335 have a high voltage level such as $V_{CC}$, turning on the connected bit line transistors).

After the data is transferred from the secondary page buffers to the primary page buffers, then in a step 1524, it is determined whether the data has been correctly programmed into all of the memory cells to be programmed in the second group 1390b of memory cells (the data that was transferred to the primary page buffers). If it is determined in step 1524 that the data programming operation has succeeded, then the process proceeds to step 1534 where the programming operation ends.

Otherwise, if it is determined in step 1524 that the data programming operation has failed, then the process proceeds to step 1526.

In step 1526, it is checked whether or not a maximum number of programming loops has been executed (maximum number of programming pulses have been applied to the selected word line). If so, then the process proceeds to step 1534 where the programming operation ends.

Otherwise, the process proceeds to step 1528 where, beneficially, the programming voltage $V_{PGM}$ is "stepped-up" (increased) in voltage.

Then, in a step 1530, the appropriate voltage is applied to each bit line 1330 for programming the memory cells connected to the second selected word line of the second group of memory cells 1390b. In this step, the appropriate voltages are applied to the SSL, GSL, CSL, selected word line and unselected word lines, etc. (see FIG. 6). In particular, another programming voltage pulse is applied to the selected word line. During this step, switching devices 1336 in bit lines 1330 are controlled so as to connect first and second bit line portions 1332/1334 together (e.g., group select lines 1335 have a high voltage level such as $V_{CC}$, turning on the connected bit line transistors). In this step, only the memory cells connected to the second selected word line of the second group of memory cells 1390b are programmed, the memory cells connected to the first selected word line of the first group of memory cells 1390a having already been determined to have been successfully programmed in the step 1516 above.

Next, in a step 1532, a data read operation is performed to verify whether data has been correctly programmed into all of the memory cells of the second groups 1390b to be programmed. In this step, the appropriate voltages are applied to the SSL, GSL, CSL, selected word lines and unselected word lines, etc. (see FIG. 6). Data from the selected memory cells of the second group 1390b is transferred to the primary page buffers. During this step, switching devices 1336 in bit lines 1330 are controlled so as to connect first and second bit line portions 1332/1334 together (e.g., group select lines 1335 have a high voltage level such as $V_{CC}$, turning on the connected bit line transistors).

Then, the process returns to step 1524.

Of course the above-described process is exemplary, and other embodiments accomplishing the same objectives are possible.

Figure 16:
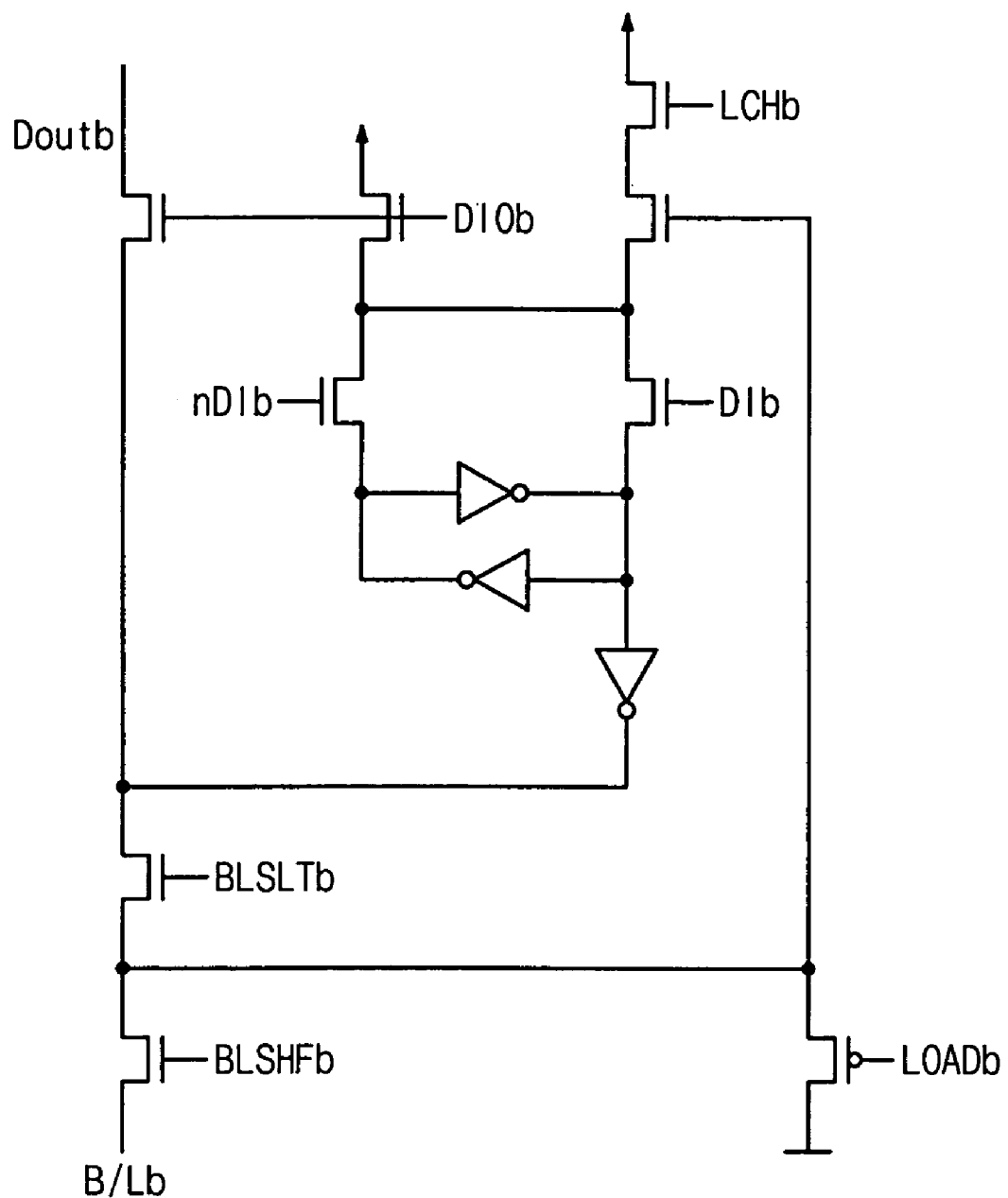
FIG. 16 shows an embodiment of a secondary page buffer.

FIG. 16 shows an embodiment of a primary page buffer 1600 that may be included in primary page buffer block 1360 of FIGS. 13 and 14.

Figure 17:
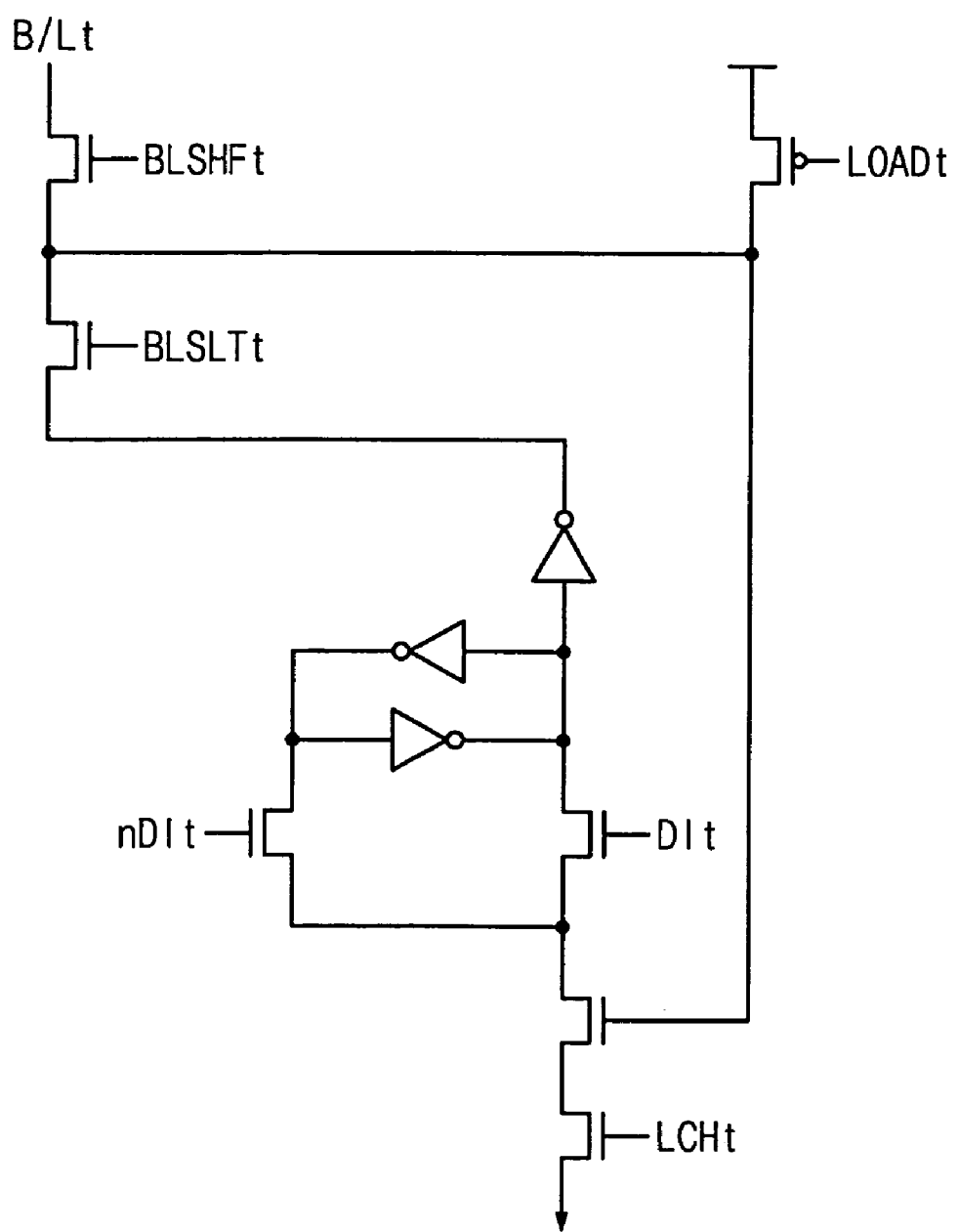
FIG. 17 shows an embodiment of a secondary page buffer.

FIG. 17 shows an embodiment of a secondary page buffer 1700 that may be included in secondary page buffer block 1365 of FIGS. 13 and 14. Secondary page buffer 1700 may have a more simple structure than primary page buffer 1600, as secondary page buffer 1700 only interfaces with bit line 1330 and is not required to interface with data decoder 1380, as primary page buffer 1600 must do.

Accordingly, by providing each bit line of a NAND flash memory device with a switching transistor to divide the bit line into first and second (or more) bit line portions, the loading on each bit line can be reduced. Furthermore, when secondary page buffers are also supplied to the NAND flash memory device, two pages of memory cells connected to a same group of bit lines can be programmed in a single programming operation, to achieve "double-speed" programming.

While preferred embodiments are disclosed herein, many variations are possible which remain within the concept and scope of the invention. Such variations would become clear to one of ordinary skill in the art after inspection of the specification, drawings and claims herein. The invention therefore is not to be restricted except within the spirit and scope of the appended claims.

I claim:

1. A NAND flash memory device, comprising:
an array of NAND flash memory cells;
a plurality of word lines connected to the NAND flash memory cells; and
a plurality of bit lines connected to the NAND flash memory cells,
wherein the bit lines each comprise,
a first bit line portion,
a second bit line portion, and
a switching device extending between the first and second bit line portions to selectively connect the first and second bit line portions together, and
wherein at least a first NAND flash memory cell is connected to the first bit line portion, and at least a second NAND flash memory cell is connected to the second bit line portion.

2. The NAND flash memory device of claim 1, wherein the switching devices of the bit lines each include a control terminal connected to a group select line.

3. The NAND flash memory device of claim 1, wherein the NAND flash memory cells are divided into memory blocks corresponding to one or more word lines, and wherein the first bit line portions are connected to a first memory block, and the second bit line portions are connected to a second memory block.

4. The NAND flash memory device of claim 1, wherein the NAND flash memory cells are divided into memory blocks corresponding to one or more word lines, and wherein the first bit line portions are connected to a first plurality of memory blocks, and the second bit line portions are connected to a second plurality of memory blocks.

5. The NAND flash memory device of claim 4, wherein the first plurality of memory blocks is greater than the second plurality of memory blocks.

6. The NAND flash memory device of claim 1, wherein the bit lines each further comprise:
a third bit line portion; and
a second switching device extending between the second and third bit line portions to selectively connect the second and third bit line portions,
wherein at least a third NAND flash memory cell is connected to the third bit line portion.

7. The NAND flash memory device of claim 6, wherein a control terminal of the first switching devices for the bit lines are all connected to a first group select line, and a control terminal of the second switching devices for the bit lines are all connected to a second group select line.

8. The NAND flash memory device of claim 6, wherein NAND flash memory cells are divided into a plurality of memory blocks corresponding to one or more word lines, and wherein the first bit line portions are connected to a first plurality of memory blocks, the second bit line portions are connected to a second plurality of memory blocks, and the third bit line portions are connected to a third plurality of memory blocks.

9. The NAND flash memory device of claim 1, further comprising:
a primary page buffer connected to at least one first bit line portion; and
a secondary page buffer connected to at least one second bit line portion.

10. The NAND flash memory device of claim 9, wherein the secondary page buffer is not connected to a data input/output bus.

11. The NAND flash memory device of claim 9, wherein the primary page buffer is adapted to transfer second data to the secondary page buffer to be programmed into the NAND flash memory cells connected to the second bit line portions.

12. The NAND flash memory device of claim 9, wherein NAND flash memory cells are divided into a plurality of memory blocks corresponding to one or more word lines, and wherein the first bit line portions are connected to a first memory block, and the second bit line portions are connected to a second memory block.

13. The NAND flash memory device of claim 12, wherein the primary page buffer is adapted to transfer second data to the secondary page buffer to be programmed into the second memory block.

14. The NAND flash memory device of claim 9, wherein the first page buffer is adapted to program NAND flash memory cells of the first memory block while the second page buffer programs NAND flash memory cells of the second memory block.

15. The NAND flash memory device of claim 1, further comprising a page buffer connected to the first bit line portions, wherein the switching device is controlled to connect the first and second bit line portions when reading data from the second NAND flash memory cell, and the switching device is controlled to disconnect the first and second bit line portions when reading data from the first NAND flash memory cell.

16. For a NAND flash memory device comprising an array of NAND flash memory cells arranged in a plurality of word lines and a plurality of bit lines, the bit lines each comprising a first bit line portion, a second bit line portion, and a switching device extending between the first and second bit line portions to selectively connect the first and second bit line portions, and further comprising a first page buffer connected to the first bit line portions and a second page buffer connected to the second bit line portions, a method of programming the NAND flash memory cells, comprising:

loading into the primary page buffer second data to be programmed into second NAND flash memory cells connected to the second bit line portions;

transferring the second data from the primary page buffer to the secondary page buffer;

loading into the primary page buffer first data to be programmed into first NAND flash memory cells connected to the first bit line portions;

controlling the switching devices to disconnect the first and second portions of the bit lines from each other; and programming the first NAND flash memory cells with the first data of the primary page buffer while programming the second NAND flash memory cells with the second data of the secondary page buffer.

17. The method of claim 16, wherein programming the first NAND flash memory cells with the first data of the first page buffer while programming the second NAND flash memory cells with the second data of the second page buffer comprises, applying a first voltage pulse to a first word line connected to the first NAND flash memory cells and to a second word line connected to the second NAND flash memory cells.

18. The method of claim 17, wherein programming the first NAND flash memory cells with the first data of the first page buffer while programming the second NAND flash memory cells with the second data of the second page buffer further comprises:

(1) verifying the first data programmed into the first NAND flash memory cells;

(2) when the verification indicates the first data has not been programmed into one or more of the first NAND flash memory cells, determining whether a final voltage pulse has been applied to the first word line;

(3) when the final voltage pulse has been applied, discontinuing programming the first and second NAND flash memory cells;

(4) when the verification indicates the first data has not been programmed into the one or more of the first NAND flash memory cells and the final voltage pulse has not been applied to the first word line, applying another voltage pulse to the first word line connected to the first NAND flash memory cells; and (5) repeating steps (1) through (4) until all of the first data has been programmed into the first NAND flash memory cells.

19. The method of claim 18, wherein programming the first NAND flash memory cells with the first data of the primary page buffer while programming the second NAND flash memory cells with the second data of the secondary page buffer further comprises:

(6) dumping the second data from the secondary page buffer to the primary page buffer;

(7) verifying the second data programmed into the second NAND flash memory cells;

(8) determining whether a final voltage pulse has been applied, and when the final voltage pulse has been applied, discontinuing programming the second NAND flash memory cells;

(9) when the verification indicates the second data has not been programmed into the one or more of the second NAND flash memory cells and the final voltage pulse has not been applied to the second word line, applying another voltage pulse to the second word line connected to the second NAND flash memory cells; and

(10) repeating steps (6) through (9) until all of the second data has been programmed into the second NAND flash memory cells.

20. The method of claim 19, wherein steps (6) through (10) are performed with the primary page buffer.

* * * * *